United States Patent
Yoo

(10) Patent No.: US 6,200,836 B1
(45) Date of Patent: Mar. 13, 2001

(54) USING OXIDE JUNCTION TO CUT OFF SUB-THRESHOLD LEAKAGE IN CMOS DEVICES

(75) Inventor: Chue-San Yoo, Hsin-Chu (TW)

(73) Assignee: Taiwan Semiconductor Manufacturing Company, Hsin-Chu (TW)

( * ) Notice: Subject to any disclaimer, the term of this patent is extended or adjusted under 35 U.S.C. 154(b) by 0 days.

(21) Appl. No.: 09/368,862

(22) Filed: Aug. 6, 1999

(51) Int. Cl.[7] .................. H01L 21/00; H01L 21/84; H01L 21/336
(52) U.S. Cl. .................. 438/163; 438/297; 438/301
(58) Field of Search .................. 438/163, 301, 438/305, 297, 300, 303, 586

(56) References Cited

U.S. PATENT DOCUMENTS

| | | | |
|---|---|---|---|
| 4,683,637 | 8/1987 | Varker et al. | 437/63 |
| 4,772,927 | 9/1988 | Saito et al. | 357/23.7 |
| 5,393,693 | * 2/1995 | Ko et al. | 437/69 |
| 5,488,004 | 1/1996 | Yang | 437/35 |
| 5,641,980 | * 6/1997 | Yamaguchi et al. | 657/347 |
| 5,712,173 | * 1/1998 | Liu et al. | 437/24 |
| 5,736,454 | * 4/1998 | Hwu et al. | 438/585 |
| 5,837,571 | 11/1998 | Pathak | 438/199 |

\* cited by examiner

*Primary Examiner*—Ricahrd Booth
*Assistant Examiner*—Walter L. Lindsay, Jr.
(74) *Attorney, Agent, or Firm*—George O. Saile; Stephen B. Ackerman

(57) ABSTRACT

A new method is provided for the formation of Lightly Doped Drain (LDD) regions in MOS devices. The body of the gate electrode is formed including the self-aligned LDD regions. After the LDD regions have been formed, an oxide implant is performed under an angle into the surface of the substrate on which the MOS device is being formed. This oxide implant forms an oxide layer around the interface between the source/drain regions and the surrounding silicon. The spacers for the gate electrode are formed, the source/drain region implant is completed. This implanted oxygen junction is subjected to a thermal treatment thereby forming an oxide layer around the source/drain regions. This oxide layer eliminates the leakage current across the interface between the source/drain regions and the surrounding silicon further forcing the saturation current between these regions to flow along the surface of the silicon substrate.

24 Claims, 2 Drawing Sheets

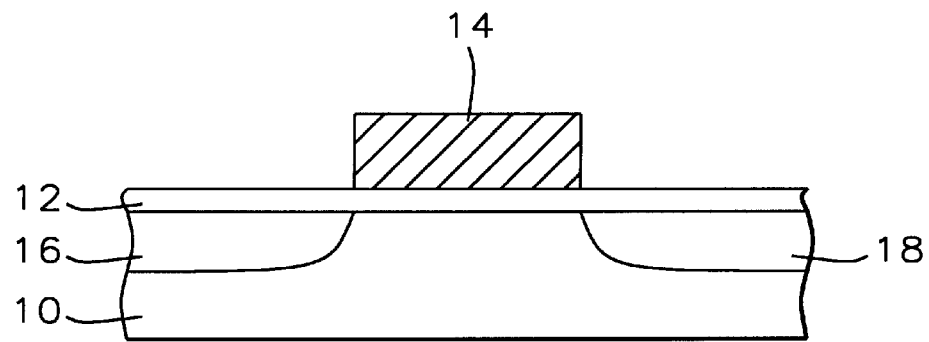
*FIG. 1a - Prior Art*
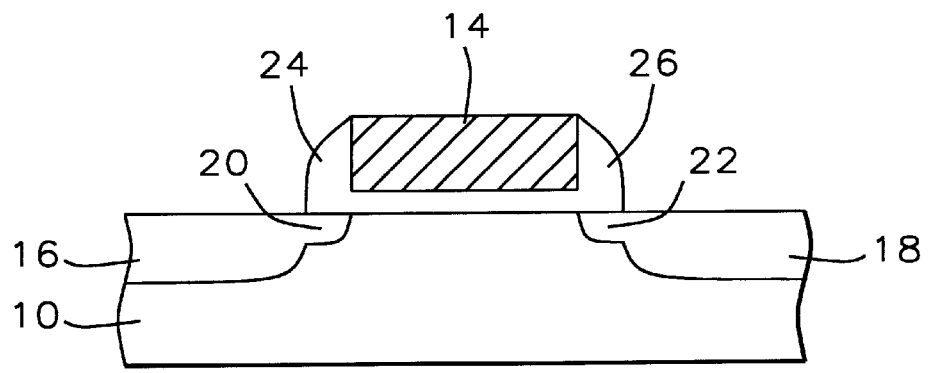
*FIG. 1b - Prior Art*

USING OXIDE JUNCTION TO CUT OFF SUB-THRESHOLD LEAKAGE IN CMOS DEVICES

BACKGROUND OF THE INVENTION (1) Field of the Invention

The invention relates to the fabrication of integrated circuit devices, and more particularly, to a method to eliminate sub-threshold leakage current in sub-micron gate electrode structures of CMOS devices.

(2) Description of the Prior Art

Recent developments in the design and manufacturing of semiconductor devices have extended the field for Very Large-Scale Integrated (VLSI) devices to Ultra Large-Scale Integrated (ULSI) devices. For ULSI devices the target device feature size is now in the micron and sub-micron range where there is development work taking place relating to deep sub-micron sizes that reach below 0.5 um. The attainment of the sharp reduction in device feature sizes has mainly been accomplished with gradual but significant advances in supporting technologies such as photolithography and improved etching techniques such as Reactive Ion Etching (RIE). These developments have been taking place concurrent with improvements in photo-imaging techniques and advancements in exposure methods and the wavelengths of the exposure sources that now reach into the Deep Ultra Violet range. Special techniques such as the application of special layers of material further improve focusing depth and sharpness of focus in creating images in for instance layers of photoresist that are applied to create interconnect lines, vias, contact openings and the like. These techniques are equally applied in the formation of for instance Complementary Metal Oxide Semiconductor (CMOS) devices.

The technique of creating complementary n-channel and p channel devices has long been known and applied in the semiconductor industry. The salient advantage of these devices is their low power usage due to the fact that two transistors are paired as complementary n-channel and p-channel transistors whereby in either logic state (on/off) of the device, one of the two transistors is off and negligible current is carried through this transistor. The logic elements of Complementary Metal Oxide devices drain significant amounts of current only at the time that these devices switch from one state to another state. Between these transitions the devices draw very little current resulting in low power dissipation for the CMOS device.

A typical n-channel transistor for a CMOS inverter is formed by first forming a p-region (also called tub or well) in the surface of an n-type silicon substrate. Referring to FIG. 1a, there is shown a cross section of a typical MOS transistor that is formed on the surface of a silicon substrate 10. A layer 12 of gate oxide is first formed over the surface of the substrate 10, this layer 12 of oxide serves as a stress relieve layer between the gate of the MOS transistor and the silicon surface. A layer of polysilicon or the like is deposited over the layer of gate oxide 12 and patterned and etched to form the structure 14 of the gate electrode. Source and drain regions (16 and 18 respectively) are then formed self-aligned with and adjacent to the gate electrode 14 by implanting of high-concentration n-type impurities into the surface of the silicon substrate 10. In the era of ULSI devices, the width of the gate has been reduced to below 0.5 um, the distance between the source and the drain region (the channel length) is correspondingly reduced. This sharp reduction in channel length however leads to a significant increase in the concentration of the electro-magnetic field close to drain region 18 where this drain region interfaces with the underlying silicon substrate 10. This sharp increase may lead to leakage current between the drain region 18 and the surrounding silicon of substrate 10. In addition, hot carriers can be created in the silicon of the substrate 10 and can gain sufficient energy to penetrate into the layer of gate oxide 12 underneath the gate structure 14 resulting in impacting the threshold voltage between the gate 14 and the substrate 10. This may lead to current flow between the gate electrode 14 and the underlying substrate 10.

To counteract the increase in the electric field, the art has implemented the formation of Lightly Doped Drain (LDD) regions 20 and 22 that are shown in FIG. 1b. The LDD regions 20 and 22 form double off-set regions whereby the source and drain regions now contain high n-type impurity concentrations 16 and 18 and low n-type impurity concentrations 20 and 22. The principle objective of the LDD regions 20 and 22 is to offset the high concentration of the electric field around the drain region 18. The regions are symmetrically formed around the gate electrode and consist of low-concentrations of n-type impurities 20 and 22. The profile of the implanted regions 20 and 22 indicates that the impurity concentrations in the p-n junction change gradually thereby extending to the source and drain regions to attenuate the electric field.

With the creation of the LDD regions 20 and 22, the breakdown between the drain region 18 and the channel region between the source and the drain region has been eliminated. Hot carriers that could effect the threshold voltage are thereby also eliminated. However, the low concentration regions 20 and 22 form high resistivity regions by their nature of being low concentration impurity regions. Since the current flows between the source and drain regions, the regions 20 and 22 are now parasitic resistances that are connected in series between the source and the drain regions. This lowers the drain current and the n-resistance performance of the transistor thereby reducing the performance of the device. Sidewalls 24 and 26 of the gate electrode structure 14 that have been formed on the surfaces of the low-concentration n-source and drain regions further emphasizing this effect. The high electric field that is in effect around the drain region 18 generates hot carriers, some of these carriers may be injected into the lower portion of the sidewall 26 of the drain region 18. The region of the silicon surface of the n-type impurity 22 becomes depleted of carriers due to the electric field that is created by the hot carriers that have become trapped in the underlying layer of gate oxide 12. This results in an increase of the threshold voltage of the transistor thereby having a negative effect on the drain characteristics and ultimately on the reliability of the transistor.

The above indicated problems in the fabrication of LDD CMOS transistors leads to a requirement for alternate methods of creating these devices, methods that counteract the creation of hot carriers and the resulting parasitic resistance. This requirement takes on increased urgency for devices with micron and sub-micron device features where the impact of leakage current is only further emphasized.

U.S. Pat. No. 5,837,571 (Pathak) shows a process for forming FET with multiple dopant I/I and an $O_2$ I/I to change the S/D dopant profiles.

U.S. Pat. No. 4,683,637 (Varker et al.), U.S. Pat. No. 5,488,004 (Yang), and U.S. Pat. No. 5,712,173 (Liu et al.) show SOI devices with $O_2$ I/I's.

U.S. Pat. No. 4,772,927 (Saito et al.) teaches an $O_2$ I/I into S/D regions.

SUMMARY OF THE INVENTION

A principle objective of the invention is to prevent increases in the threshold voltage in MOS devices.

Another objective of the invention is to provide a method to eliminate sub-threshold leakage current in MOS devices.

Yet another objective of the invention is to provide a method to create high-performance MOS transistors that do not have threshold leakage current.

In accordance with the objectives of the invention a new method is provided for the formation of Lightly Doped Drain (LDD) regions in MOS devices. The body of the gate electrode is formed including the self-aligned LDD regions. After the LDD regions have been formed, an oxide implant is performed under an angle into the surface of the substrate on which the MOS device is being formed. This oxide implant forms an oxide layer around the interface between the source/drain regions and the surrounding silicon. The spacers are formed, the source/drain region implant is completed. This implanted oxygen junction is subjected to a thermal treatment thereby forming an oxide layer around the source/drain regions. This oxide layer eliminates the leakage current across the interface between the source/drain regions and the surrounding silicon further forcing the saturation current between these regions to flow along the surface of the silicon substrate.

BRIEF DESCRIPTION OF THE DRAWINGS

FIG. 1 shows a Prior Art MOS transistor.

DESCRIPTION OF THE PREFERRED EMBODIMENTS

Figure 2:
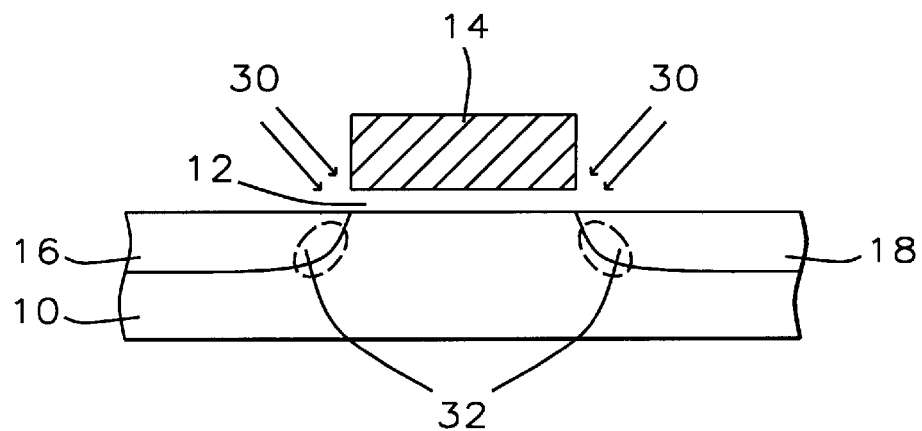
FIG. 2 shows a cross section of the oxygen tilt implant.

Referring now specifically to FIG. 2, there is shown a cross section of the gate electrode structure to which a tilt angle implant of oxygen is being performed. The LDD regions 16 and 18 for the source and drain regions of the gate electrode have been created.

It is, as previously has been pointed out, common practice to start the creation of gate electrodes by first creating a layer 12 of gate oxide on the surface of the substrate. This layer of gate oxide can be created by thermally oxidizing the device region thereby forming a thin layer of oxide that is typically between about 30 and 80 Angstrom thick. The layer 12 created under the gate electrode 14 can also be created using tantalum oxide in which case the preferred thickness of the layer is between about 80 and 120 Angstrom.

Gate electrode 14 can be formed by CVD using polysilicon or SiGe. Conventional photolithographic techniques and anisotropic plasma etching are used to pattern the gate structure. Polysilicon layer 14 is preferably deposited using Low Pressure CVD (LPCVD), the thickness of the polysilicon layer is between about 1500 and 3000 Angstrom and can be doped with a n+ conductive dopant, for instance arsenic, with a preferred dopant concentration between about 1.2E20 and 2.8E20 atoms/cm$^3$. By performing a light (lightly doped) implant of an N-type impurity, such as arsenic, an n$^-$ region is formed. The LDD implant for regions 16 and 18 can therefore for instance use arsenic or phosphorous, the LDD implant can be performed with an implant energy within the range of between about 25 and 75 KeV and a dose within the range of between about 5E11 and 5E13 atoms/cm$^3$.

After the LDD regions have been formed, the oxygen implants 30 are performed. Implant 30 can be provided by oxygen at a dose in the range $1 \times 10^{12}$ to $1 \times 10^{13}$ atoms/cm$^3$ and an energy in the range of 2 to 30 kilo electron volts. It must be noted that implant 30 is an angle implant, the tilt of the angle of the implant 30 with respect to the plane of the substrate is between about 30 and 60 degrees.

Figure 3:
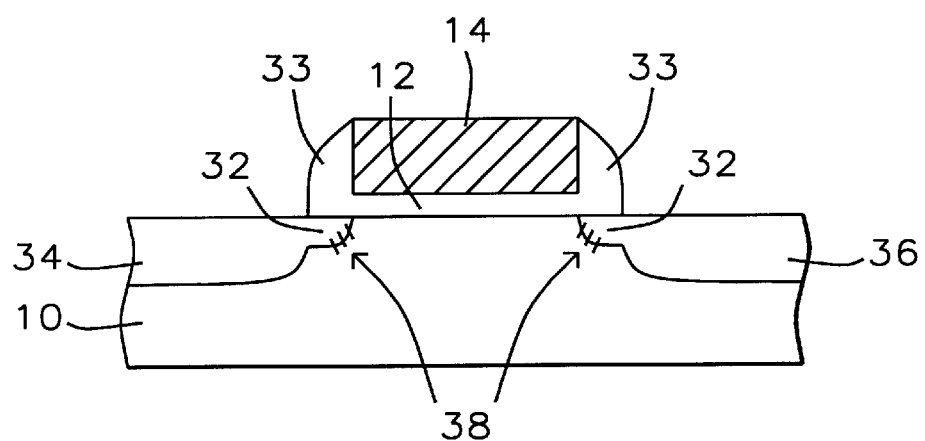
FIG. 3 shows a cross section of the MOS gate after the formation of the leakage barrier between the source/drain regions and the surrounding well of the transistor.

FIG. 3 shows a cross section of the gate electrode after the gate spacers 33 have been formed on the sidewalls of the gate structure. These sidewall spacers 33 can be formed by depositing a conformal first insulating layer, preferably a low temperature SiO$_2$, and anisotropically plasma etching back to the surface of the substrate 10. For instance, the SiO$_2$ can be a Chemical Vapor Deposition (CVD) using tetra-ethyl-ortho-silicate (TEOS) at a temperature between about 650 and 900 degrees C. while the etchback can be a Reactive Ion Etchback (RIE).

The gate spacers can also be formed by a process including a substantially conformal deposition within the polysilicon trenches of a spacer material selected from the group consisting of nitride, oxide, BSG, PSG and any combination thereof, and a subsequent, substantially anisotropic etch of the spacer material.

FIG. 3 further shows the regions 34 and 36 of n$^+$ implant. By performing a heavy implant (heavily doped) of N-type impurities, a n$^+$ region is formed. This n$^+$ implant can be provided by arsenic at a dose in the range of $1 \times 10^2$ to $1 \times 10^{13}$ atoms/cm$^3$ and an energy in the range of 40 to 100 KeV.

After this n$^+$ implant has been completed, the device is subjected to a heat treatment. This heat treatment forms the oxide layers 38 at the interface between the source/drain regions 32 and the surrounding silicon substrate. The heat treatment concentrates the previously injected oxygen ions (oxygen implant 30) and forms a firm barrier 38 as indicated. Barrier or layer 38 seals off the leakage current between the source/drain regions and the surrounding substrate while at the same time forcing the saturation current between the source and the drain region to flow along the interface between the silicon substrate and the overlying layer 12 of gate oxide.

Although the invention has been described and illustrated with reference to specific illustrative embodiments thereof, it is not intended that the invention be limited to those illustrative embodiments. Those skilled in the art will recognize that variations and modifications can be made without departing from the spirit of the invention. It is therefore intended to include within the invention all such variations and modifications which fall within the scope of the appended claims and equivalents thereof.

What is claimed is:

1. A method of creating source and drain regions in a CMOS device in the surface of a semiconductor substrate, comprising:

providing a semiconductor substrate;

forming isolation regions in said semiconductor substrate, thereby creating active regions within said substrate;

forming a p-well in said active regions of said substrate;

creating a partial gate electrode structure on the surface of said substrate overlying said p-well;

performing a tilt angle oxygen implant into the source/drain regions of said partial gate electrode structure;

forming the spacers for said gate electrode structure;

completing the source and the drain implant for said partial gate electrode structure; and performing a thermal treatment of said substrate.

2. The method of claim 1 wherein said creating a partial gate electrode is:
  creating a layer of gate oxide on the surface of said substrate;
  depositing a layer of gate dielectric material over said gate oxide;
  patterning and etching said layer of polysilicon thereby forming said partial gate electrode structure; and
  performing a self-aligned LDD implant of an n-type impurity.

3. The method of claim 2 wherein said gate dielectric material is selected from the group containing oxide, nitride, polysilicon and SiGE.

4. The method of claim 2 wherein said gate dielectric material can be formed by RTO oxide or by JVD oxide or by RTP $S_iN$ or by RTP $SiO_xN_y$ or by JVD $T_iO_2$ or by JVD $TaO_2$.

5. The method of claim 2 wherein said performing a self-aligned LDD implant is an arsenic or phosphorous implant performed with an implant energy within the range of between about 25 and 75 keV and a dose within the range of between about 5E11 and 5E13 atoms/cm³.

6. The method of claim 2 wherein said depositing a layer of gate dielectric material uses Low Pressure CVD (LPCVD) the thickness of said gate dielectric material layer is between about 1500 and 3000 Angstrom.

7. The method of claim 1 wherein said performing a tilt angle oxygen implant is implanting oxygen at a dose in the range $1 \times 10^{12}$ to $1 \times 10^{13}$ atoms/cm³ and an energy in the range of 2 to 30 kilo electron volts said implant to be performed under an angle of about 30 to 60 degrees with respect to the plane of said substrate.

8. The method of claim 1 wherein said forming the spacers for said gate electrode structure comprises the thermally growing of a thin oxide on the sides of said gate electrode using a short dry-oxidation process whereupon a conformal CVD oxide film is deposited by decomposing TEOS at between 700 and 750 degrees C. followed by an anisotropic dry etch thereby leaving said spacers on the sidewalls of said gate electrode holes.

9. The method of claim 1 wherein said forming the spacers for said gate electrode structure is forming said spacers by a process including a substantially conformal deposition of a spacer material selected from the group consisting of nitride, oxide, BSG, PSG and any combination thereof, and a subsequent, substantially anisotropic etch of said spacer material.

10. The method of claim 1 wherein said forming the spacers for said gate electrode structure is depositing a conformal first insulating layer, preferably a low temperature $SiO_2$, and anisotropically plasma etching back to the surface of said substrate whereby said insulator is deposited using a chemical vapor deposition (CVD) using tetra-ethyl-ortho-silicate (TEOS) at a temperature between about 650 and 900 degrees C. while the etchback is a reactive ion etcher (RIE).

11. The method of claim 1 wherein said completing the source and the drain implant for said partial gate electrode structure is a self aligned n⁺ implant into the surface of said substrate provided by arsenic or phosphorous with an implant energy within the range of between about 30 and 100 keV and a dose within the range of between about 1E14 and 1E16 atoms/cm³.

12. A method of creating source and drain regions in a CMOS device in the surface of a semiconductor substrate, comprising:
  providing a semiconductor substrate;
  forming isolation regions in said semiconductor substrate, thereby creating active regions within said substrate;
  forming a p-well in said active regions of said substrate;
  creating a partial gate electrode structure on the surface of said substrate overlaying said p-well said partial gate structure to contain a gate electrode with self-aligned Lightly Doped Drain regions;
  performing a tilt angle oxygen implant into the source/drain regions of said partial gate electrode structure whereby said tilt angle implant is an oxygen implant at a dose in the range $1 \times 10^{12}$ to $1 \times 10^{13}$ atoms/cm³ and an energy in the range of 2 to 30 kilo electron volts said implant to be performed under an angle of about 30 to 60 degrees with respect to the plane of said substrate;
  forming the spacers for said gate electrode structure;
  completing the source and the drain implant for said partial gate electrode structure whereby said completion is a self aligned n⁺ implant into the surface of said substrate provided by arsenic or phosphorous with an implant energy within the range of between about 30 and 100 keV and a dose within the range of between about 1E14 and 1E16 atoms/cm³.

13. A method of creating source and drain regions in a PMOS device in the surface of a semiconductor substrate, comprising:
  providing a semiconductor substrate;
  forming an n-well in the surface of said substrate;
  forming isolation regions in said semiconductor substrate, thereby creating active regions within said substrate;
  creating a partial gate electrode structure in said active regions of said substrate overlying said n-well;
  performing a tilt angle oxygen implant into the source/drain regions of said partial gate electrode structure;
  forming the spacers for said gate electrode structure;
  completing the source and the drain implant for said partial gate electrode structure; and
  performing a thermal treatment of said substrate.

14. The method of claim 12 wherein said creating a partial gate electrode is:
  creating a layer of gate oxide over the active regions of said substrate;
  depositing a layer of gate dielectric material over said gate oxide;
  patterning and etching said layer of polysilicon thereby forming said gate electrode structure; and
  performing a self-aligned LDD implant of a p-type impurity.

15. The method of claim 13 wherein said gate dielectric material is selected from the group containing oxide, nitride, polysilicon and SiGE.

16. The method of claim 13 wherein said gate dielectric material can be formed by RTO oxide or by JVD oxide or by RTP $S_iN$ or by RTP $SiO_xN_y$ or by JVD $T_iO_2$ or by JVD $TaO_2$.

17. The method of claim 13 wherein said performing a self-aligned LDD implant is a boron or indium implant performed with an implant energy within the range of between about 25 and 75 keV and a dose within the range of between about 5E11 and 5E13 atoms/cm³.

18. The method of claim 13 wherein said depositing a layer of gate dielectric material uses Low Pressure CVD (LPCVD) the thickness of said gate dielectric material layer is between about 1500 and 3000 Angstrom.

19. The method of claim 12 wherein said performing a tilt angle oxygen implant is implanting oxygen at a dose in the range $1\times10^{12}$ to $1\times10^{13}$ atoms/cm$^3$ and an energy in the range of 2 to 30 kilo electron volts said implant to be performed under an angle of about 30 to 60 degrees with respect to the plane of said substrate.

20. The method of claim 12 wherein said forming the spacers for said gate electrode structure comprises the thermally growing of a thin oxide on the sides of said gate electrode using a short dry-oxidation process whereupon a conformal CVD oxide film is deposited by decomposing TEOS at between 700 and 750 degrees C. followed by an anisotropic dry etch thereby leaving said spacers on the sidewalls of said gate electrode holes.

21. The method of claim 12 wherein said forming the spacers for said gate electrode structure is forming said spacers by a process including a substantially conformal deposition of a spacer material selected from the group consisting of nitride, oxide, BSG, PSG and any combination thereof, and a subsequent, substantially anisotropic etch of said spacer material.

22. The method of claim 12 wherein said forming the spacers for said gate electrode structure is depositing a conformal first insulating layer, preferably a low temperature SiO$_2$, and anisotropically plasma etching back to the surface of said substrate whereby said insulator is deposited using a chemical vapor deposition (CVD) using tetra-ethyl-ortho-silicate (TEOS) at a temperature between about 650 and 900 degrees C. while the etchback is a reactive ion etcher (RIE).

23. The method of claim 12 wherein said completing the source and the drain implant for said partial gate electrode structure is a self aligned p$^+$ implant into the surface of said substrate provided by boron or indium at a dose in the range of 1E14 to 1E16 atoms/cm$^3$ and an energy in the range of 30 to 100 kilo electron volts.

24. A method of creating source and drain regions in a CMOS device in the surface of a semiconductor substrate, comprising:

providing a semiconductor substrate;

forming isolation regions in said semiconductor substrate, thereby creating active regions within said substrate;

forming a n-well in the active regions of said substrate;

creating a partial gate electrode structure on the surface of said substrate overlying said n-well said partial gate structure to contain a gate electrode with self-aligned Lightly Doped Drain regions in the surface of the substrate and adjacent to said gate electrode;

performing a tilt angle oxygen implant into the source/drain regions of said partial gate electrode structure whereby said tilt angle implant is an oxygen implant at a dose in the range $1\times10^{12}$ to $1\times10^{13}$ atoms/cm$^3$ and an energy in the range of 2 to 30 kilo electron volts said implant to be performed under an angle of about 30 to 60 degrees with respect to the plane of said substrate;

forming the spacers for said gate electrode structure;

completing the source and the drain implant for said partial gate electrode structure whereby said completion is a self aligned p$^+$ implant into the surface of said substrate provided by boron or indium at a dose in the range of 1E14 to 1E16 atoms/cm$^3$ and an energy in the range of 30 to 100 kilo electron volts; and performing a thermal treatment of said substrate.

* * * * *